(12) United States Patent
Chen

(10) Patent No.: US 6,418,022 B1
(45) Date of Patent: Jul. 9, 2002

(54) HEAT SINK CLIP WITH OPERATING BAR

(75) Inventor: Chun-Chi Chen, Shenzhen (CN)

(73) Assignee: Foxconn Precision Components Co., Ltd., Taipei Hsien (TW)

(*) Notice: Subject to any disclaimer, the term of this patent is extended or adjusted under 35 U.S.C. 154(b) by 0 days.

(21) Appl. No.: 09/891,049

(22) Filed: Jun. 25, 2001

(30) Foreign Application Priority Data

Apr. 17, 2001 (TW) .......................... 090206019

(51) Int. Cl.$^7$ ................................. H05K 7/20
(52) U.S. Cl. .................. 361/704; 361/709; 361/717; 361/722; 257/706; 257/707; 165/80.3; 165/185
(58) Field of Search .................. 361/704, 709–711, 361/717–719, 710, 722; 24/295, 457, 535–538, 458, 495, 505, 517; 176/16.3; 257/706, 707, 719, 727; 165/80.2, 80.3, 80.4, 185; 248/316.7, 505, 510; 411/352, 516, 520, 522

(56) References Cited

U.S. PATENT DOCUMENTS

| | | | | |
|---|---|---|---|---|
| 5,617,292 A | * | 4/1997 | Steiner | 361/704 |
| 5,638,258 A | * | 6/1997 | Lin | 361/704 |
| 5,660,562 A | * | 8/1997 | Lin | 439/487 |
| 5,771,960 A | * | 6/1998 | Lin | 165/80.3 |
| 5,953,212 A | * | 9/1999 | Lee | 361/709 |

* cited by examiner

Primary Examiner—Darren Schuberg
Assistant Examiner—Michael Datskovsky
(74) Attorney, Agent, or Firm—Wei Te Chung

(57) ABSTRACT

A clip (1) comprises a main body (10) and an operating bar (30). The main body has a pressing section (12) adapted to press onto a heat sink (40). First and second arms (14, 15) extend outwardly and upwardly from opposite ends of the pressing section. A pair of flanges (24) extends perpendicularly outwardly from opposite edges of the second arm. A horseshoe-shaped locking slot (26) is defined in each flange. The operating bar has an engaging hole (19) for engagingly receiving a socket (50). A pair of sliding shafts (32) extends from opposite edges of the operating bar, and is slidably accommodated in the locking slots. Pushing the operating bar causes the sliding shafts to slide along the locking slots until they snap into place, whereby the clip is securely attached to the socket and firmly presses the heat sink against an electronic device (60).

11 Claims, 7 Drawing Sheets

HEAT SINK CLIP WITH OPERATING BAR

BACKGROUND OF THE INVENTION

1. Field of the Invention

The present invention relates to clips used for a heat sink which readily attach the heat sink onto a heat-generating electronic device in a computer.

2. Description of Prior Art

In a computer, a heat sink is often used to remove heat generated by certain electronic devices such as Central Processing Units (CPUs). A clip is frequently used to attach the heat sink to the electronic device.

Referring to FIGS. 6 and 7, a conventional clip 9 has a central pressing section 2 and a pair of resilient arms 3 extending from opposite ends thereof. Each arm 3 defines an engaging hole 5 and an operation hole 6. In assembly, the clip 9 is placed on a heat sink. Initially, one engaging hole 5 engagingly receives one ear 7 of a socket 8. A tool (not shown) is inserted into the appropriate operation hole 6 to urge the other engaging hole 5 to engagingly receive the other ear 7, thereby securing the clip 9 to the socket 8. However, the clip 9 must be forcefully driven by the tool. The tool is prone to slip and damage the electronic device and components on and around the electronic device. This is particularly disruptive and costly on a mass production assembly line. Therefore, a superior clip is desired to solve the above-mentioned problem.

SUMMARY OF THE INVENTION

Accordingly, an object of the present invention is to provide a clip which easily and safely attaches a heat sink to an electronic device.

Another object of the present invention is to provide a clip which securely attaches a heat sink to an electronic device.

In order to achieve the objects set out above, a clip of the present invention comprises a main body and an operating bar. The main body has a pressing section adapted to press onto a heat sink. First and second arms extend outwardly and upwardly from opposite ends of the pressing section. A pair of flanges extends perpendicularly outwardly from opposite edges of the second arm. A horseshoe-shaped locking slot is defined in each flange. The operating bar has an engaging hole for engagingly receiving a socket. A pair of sliding shafts extends from opposite edges of the operating bar, and is slidably accommodated in the locking slots. Pushing the operating bar causes the sliding shafts to slide along the locking slots until they snap into place, whereby the clip is securely attached to the socket and firmly presses the heat sink against an electronic device.

Other objects, advantages and novel features of the invention will become more apparent from the following detailed description when taken in conjunction with the accompanying drawings.

DETAILED DESCRIPTION OF THE INVENTION

Figure 1:
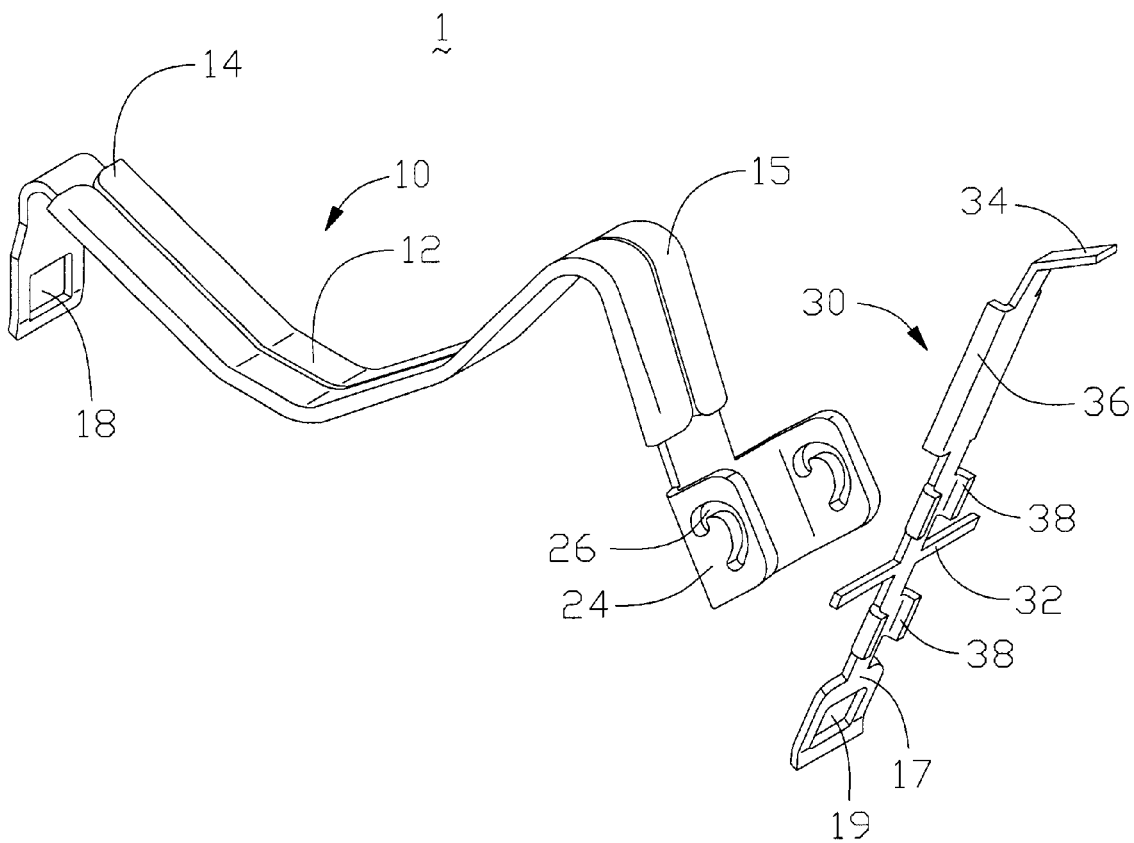
FIG. 1 is an exploded view of a clip in accordance with a preferred embodiment of the present invention.
Figure 2:
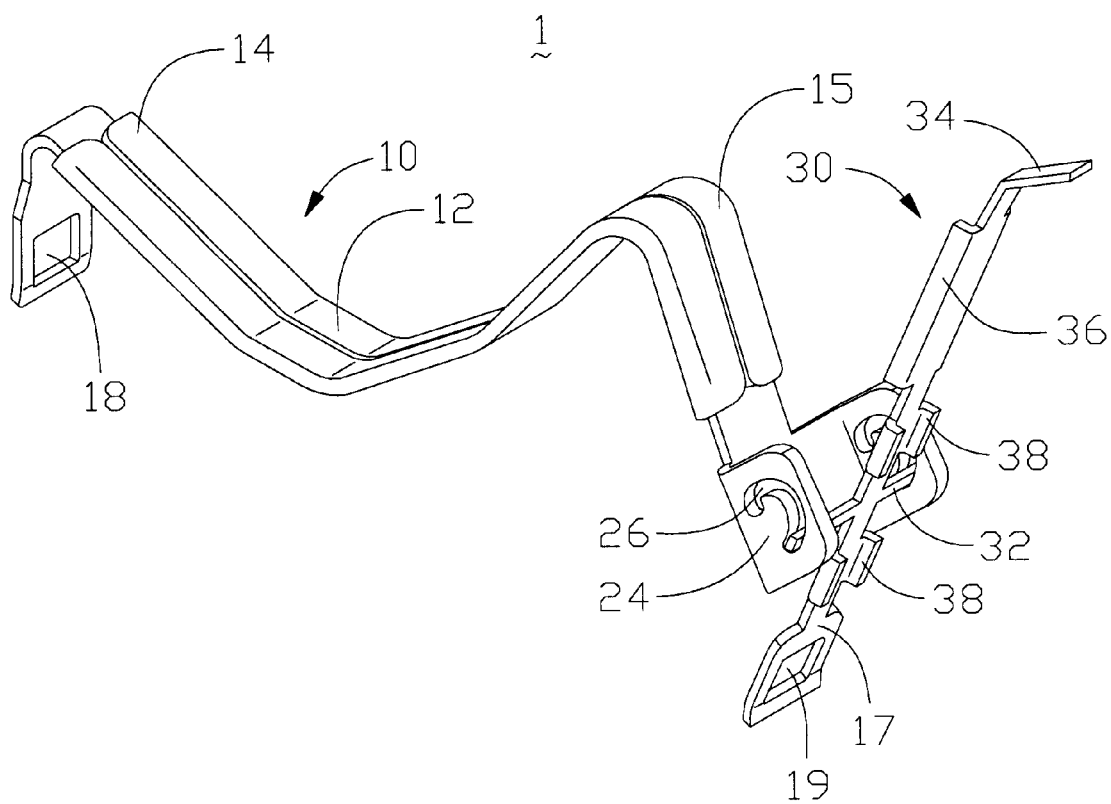
FIG. 2 is an assembled view of FIG. 1.
Figure 3:
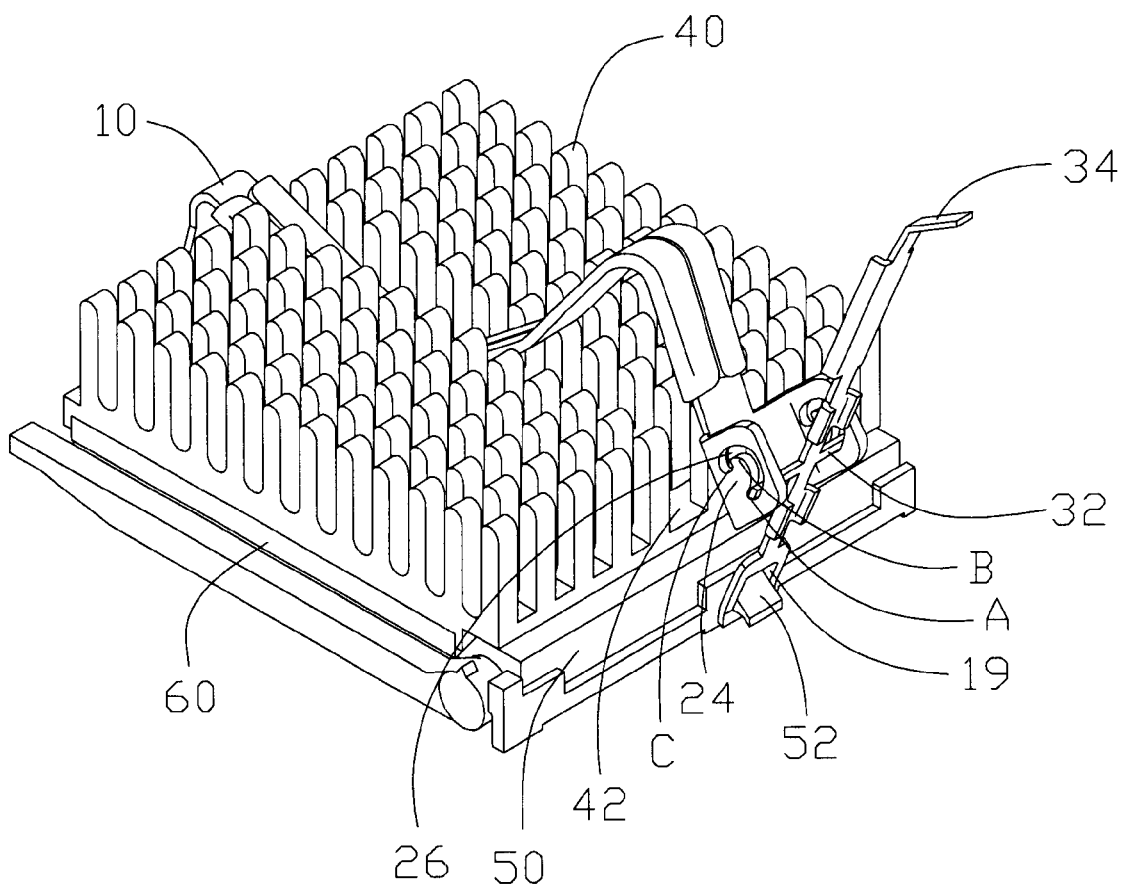
FIGS. 3 to 5 are perspective views of progressive stages of attaching the clip of FIG. 2 to a socket to thereby press a heat sink against a CPU mounted on the socket.
Figure 4:
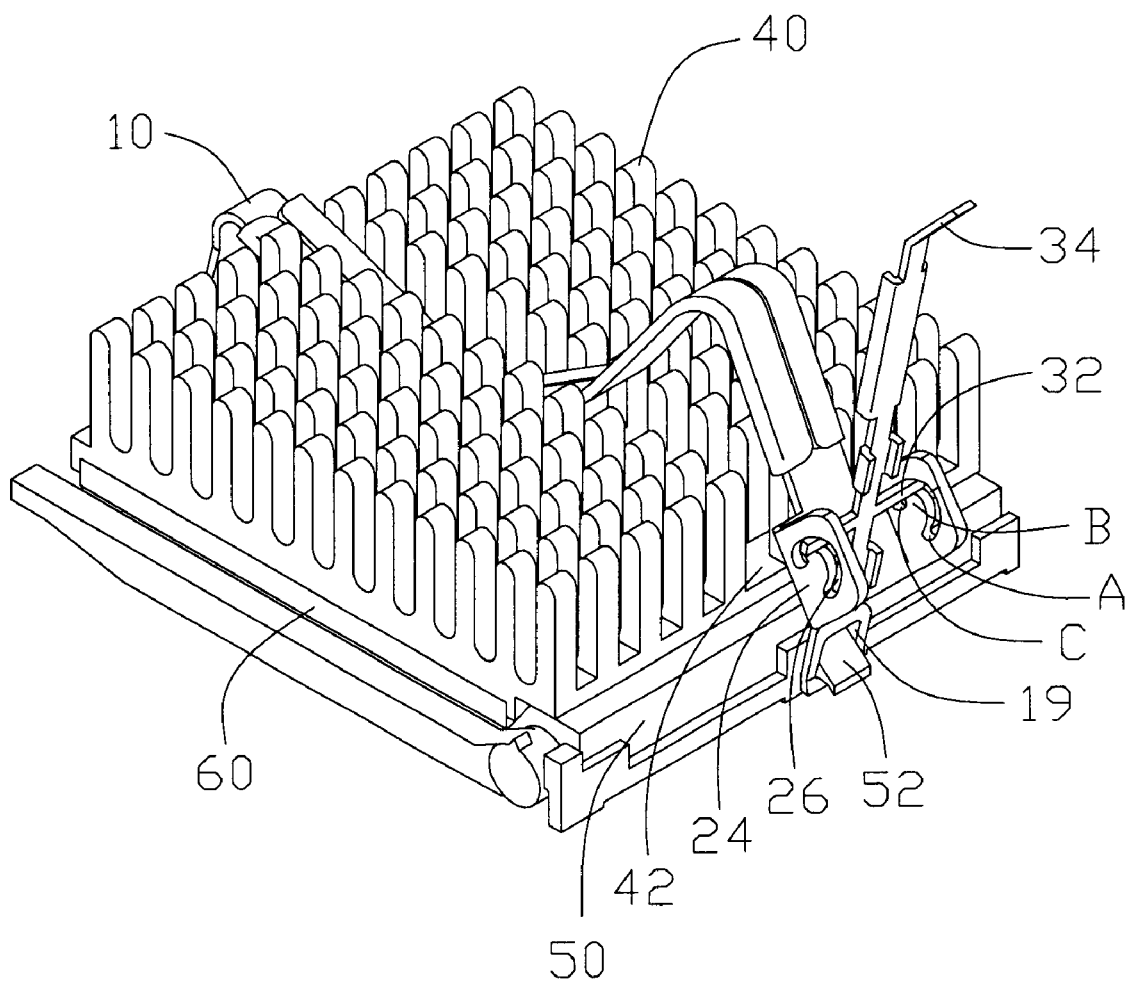
Figure 5:
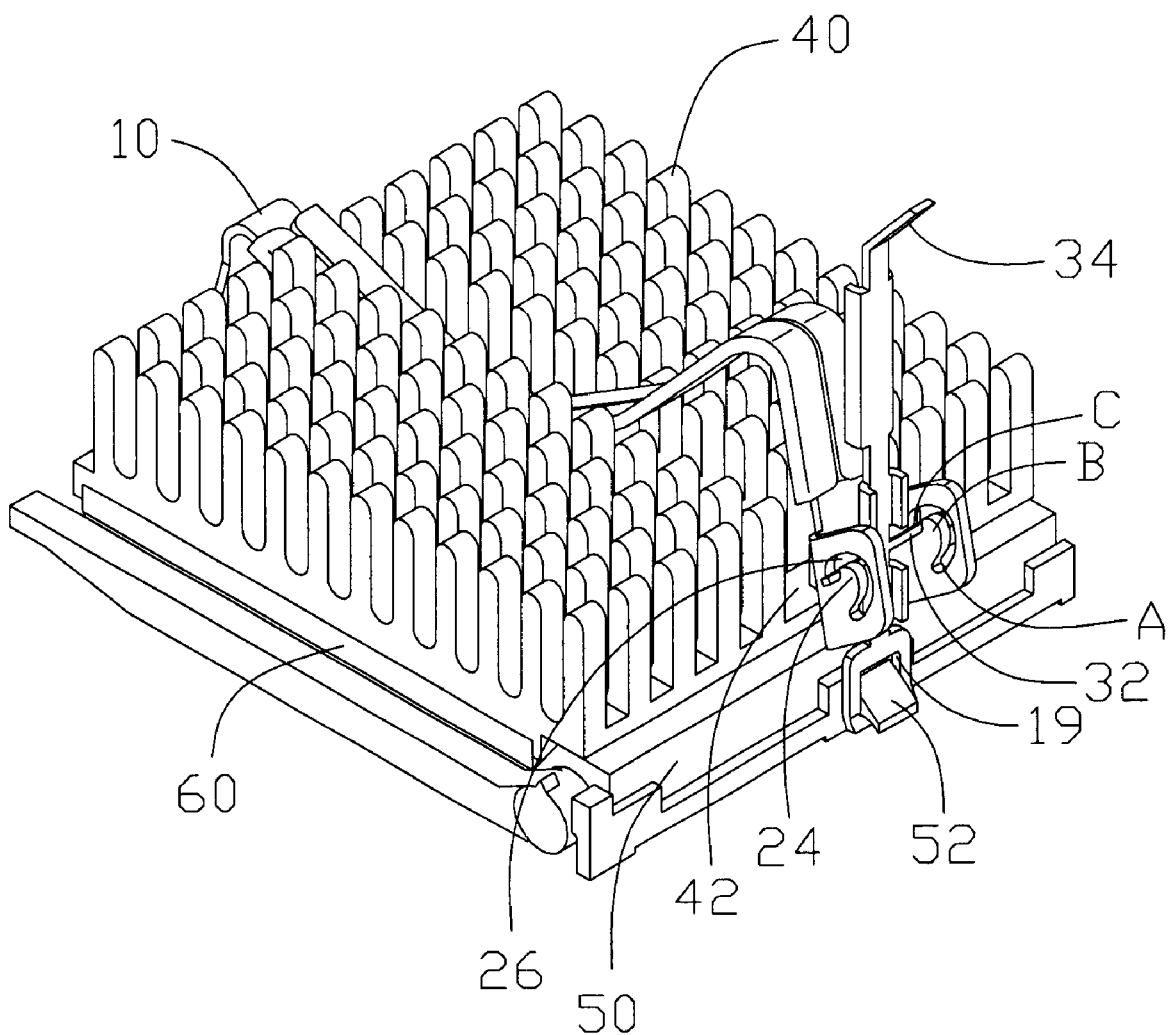
Figure 6:
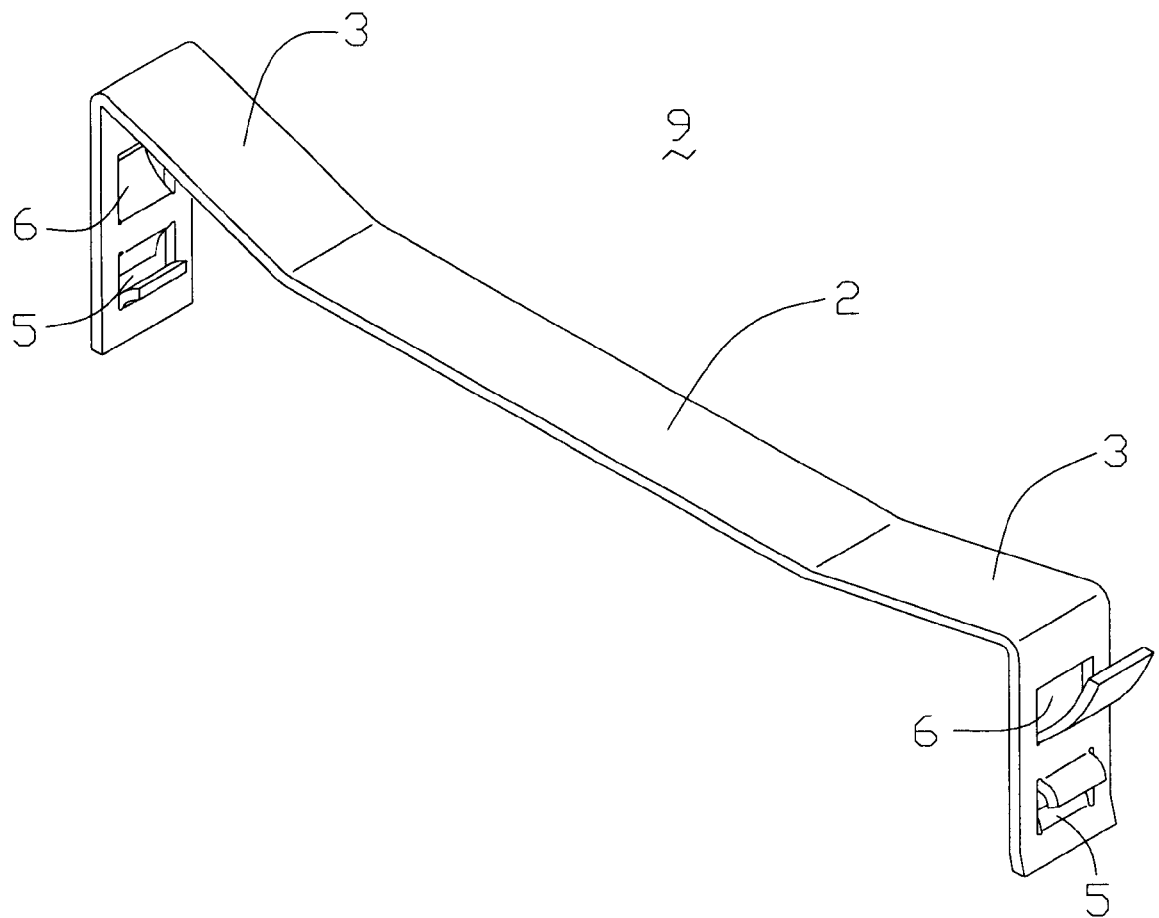
FIG. 6 is a perspective view of a conventional clip.
Figure 7:
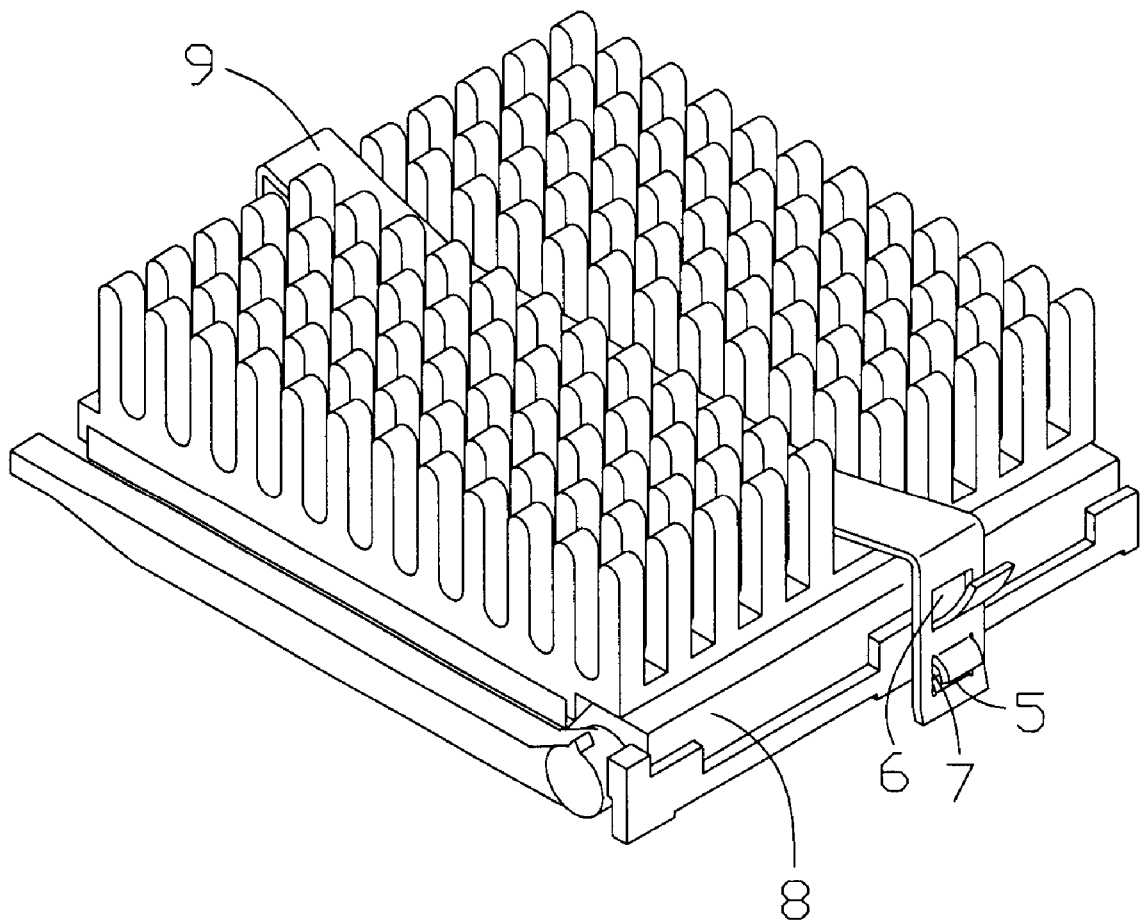
FIG. 7 is a perspective view of a conventional clip attached to a socket to thereby press a heat sink against a CPU mounted on the socket.

FIGS. 1 and 2 show a clip 1 in accordance with a preferred embodiment of the present invention. FIGS. 3 to 5 show the clip 1 attaching a heat sink 40 onto a CPU 60 mounted on a socket 50.

Referring particularly to FIG. 1, the clip 1 has a main body 10 and a separate operating bar 30. The main body 10 has a central pressing section 12 and first and second resilient arms 14, 15 extending outwardly from opposite ends of the pressing section 12 respectively. Opposite longitudinal edge portions of the pressing section 12 and first and second resilient arms 14, 15 are folded back inwardly to double over the pressing section 12 and first and second resilient arms 14, 15 respectively, thereby reinforcing the main body 10 and also allowing safe manual operation. The first arm 14 defines an engaging hole 18 near a distal end thereof. A pair of flanges 24 extends perpendicularly outwardly from opposite longitudinal edges of the second arm 15 at a distal end of the second arm 15. A generally horseshoe-shaped locking slot 26 is defined in each flange 24. Each flange 24 has a release point A adjacent a bottommost extremity of the slot 26, a lock point C adjacent an opposite extremity of the slot 26, and a vertex B below and adjacent a topmost portion of the slot 26.

The operating bar 30 is elongated. A top end of the operating bar 30 is bent outwardly to form a handle 34 for facilitating operation. A bottom end of the operating bar 30 forms a hand 17. An engaging hole 19 is defined in the hand 17, for engaging at the socket 50. A pair of sliding shafts 32 extends perpendicularly outwardly from respective opposite longitudinal edges of the operating bar 30. Distal ends of the sliding shafts 32 are adapted to be slidably accommodated in the corresponding slots 26 of the main body 10 (see FIG. 2). A pair of reinforcing ribs 38 extends perpendicularly outwardly from respective opposite longitudinal edges of the operating bar 30 above the sliding shafts 32. Another pair of reinforcing ribs 38 extends perpendicularly outwardly from respective opposite longitudinal edges of the operating bar 30 below the sliding shafts 32. A further pair of reinforcing ribs 36 extends perpendicularly inwardly from respective opposite longitudinal edges of the operating bar 30 above the uppermost reinforcing ribs 32. Thereby, the operating bar 30 is not only reinforced, but is also readily handled.

Referring particularly to FIG. 2, the main body 10 and the operating bar 30 are attached together. The sliding shafts 32 of the operating bar 30 are slidably accommodated in the corresponding slots 26 of the main body 10. The clip 1 is then ready for attaching the heat sink 40 to the CPU 60.

FIGS. 3 to 5 show progressive stages of attaching the clip 1 to the socket 50 to thereby press the heat sink 40 against the CPU 60 mounted on the socket 50. The heat sink 40 has a base and a plurality of fins extending upwardly therefrom. A receiving groove 42 is defined through a middle of the fins from one side of the base to an opposite side of the base, for receiving the main body 10 of the clip 1. The socket 50 forms a pair of ears 52 on opposite sides thereof respectively, for engaging with the clip 1.

The clip 1 is first placed in the receiving groove 42 of the heat sink 40. The engaging holes 18, 19 of the first arm 14 and the hand 17 loosely receive the ears 52 of the socket 50. The sliding shafts 32 of the operation bar 30 are initially located at the release points A of the flanges 24, as shown in FIG. 3. Then the handle 34 of the operating bar 30 is pushed toward the main body 10, thus causing the sliding shafts 32 to slide along the slots 26. The sliding shafts 32 slide compliantly over the vertices B of the flanges 24 (see FIG. 4) and finally snap into place at the lock points C of the flanges 24 (see FIG. 5). The clip 1 is thereby securely attached to the socket 50, and firmly presses the heat sink 40 against the CPU 60.

To detach the clip 1 from the heat sink 40, the handle 34 of the operating bar 30 is pulled away from the main body 10. The sliding shafts 32 slide back to the release point A. The clip 1 is thus loosened from the socket 50 and the heat sink 40, and is readily removed.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A clip for attaching a heat sink to an electronic device, comprising:

a main body having a pressing section adapted to press onto the heat sink, first and second arms extending from opposite ends of the main body, an engaging hole being defined in the first arm and adapted for engaging with the electronic device, a pair of flanges extending from opposite edges of the second arm, and a locking slot being defined in each flange; and a separate operating bar having an engaging hole adapted for engaging with the electronic device, and a pair of sliding shafts extending from opposite edges of the operating bar, the sliding shafts adapted to be slidably accommodated in the locking slots of the second arm, whereby pushing the operating bar toward the main body causes the sliding shafts to slide along the locking slots and thereby snappingly secure the heat sink to the electronic device.

2. The clip as described in claim 1, wherein each locking slot of the second arm is curved.

3. The clip as described in claim 1, wherein each locking slot of the second arm is generally horseshoe-shaped.

4. The clip as described in claim 1, wherein a handle is formed on the operating bar for facilitating operation.

5. The clip as described in claim 1, wherein opposite edge portions of the pressing section are folded back inwardly to double over the pressing section.

6. The clip as described in claim 1, wherein at least one reinforcing rib extends from at least one of opposite edges of the operating bar.

7. The clip as described in claim 1, wherein at least one pair of reinforcing ribs extends inwardly from opposite edges of the operating bar, and at least one pair of reinforcing ribs extends outwardly from opposite edges of the operating bar.

8. A heat sink assembly for dissipating heat generated by an electronic device, comprising:

a heat sink; and a clip for attaching the heat sink to the electronic device, the clip comprising:

a main body having a pressing section adapted to press onto the heat sink, first and second arms extending from opposite end of the main body, a pair of flanges extending from opposite edges of the second arm, a locking slot being defined in each flange; and a separate operating bar having engaging means adapted for engaging with the electronic device, and a pair of sliding shafts extending from opposite edges thereof, the sliding shafts adapted to be slidably accommodated in the locking slots of the second arm, whereby pushing the operating bar toward the main body causes the sliding shafts to slide along the locking slots and thereby snappingly secure the clip to the electronic device.

9. The heat sink assembly as described in claim 8, wherein each locking slot of the second arm is curved.

10. The heat sink assembly as described in claim 8, wherein each locking slot of the second arm is generally horseshoe-shaped.

11. The heat sink assembly as described in claim 8, wherein a handle is formed on the operating bar for facilitating operating.

\* \* \* \* \*